United States Patent
Bröms et al.

(10) Patent No.: US 8,184,467 B2
(45) Date of Patent: May 22, 2012

(54) CARD-LIKE MEMORY UNIT WITH SEPARATE READ/WRITE UNIT

(75) Inventors: Per Bröms, Linköping (SE); Christer Karlsson, Linköping (SE); Geirr I. Leistad, Sandvika (NO); Per Hamberg, Kisa (SE); Staffan Björklid, Linköping (SE); Johan Carlsson, Linköping (SE); Göran Gustafsson, Linköping (SE); Hans Gude Gudesen, Brussels (BE)

(73) Assignee: Thin Film Electronics ASA, Oslo (NO)

( * ) Notice: Subject to any disclaimer, the term of this patent is extended or adjusted under 35 U.S.C. 154(b) by 1031 days.

(21) Appl. No.: 11/917,571

(22) PCT Filed: Jun. 8, 2006

(86) PCT No.: PCT/NO2006/000216
§ 371 (c)(1),
(2), (4) Date: Apr. 9, 2008

(87) PCT Pub. No.: WO2006/135247
PCT Pub. Date: Dec. 21, 2006

(65) Prior Publication Data
US 2008/0198644 A1 Aug. 21, 2008

(30) Foreign Application Priority Data
Jun. 14, 2005 (NO) .................................. 20052904

(51) Int. Cl.
*G11C 11/22* (2006.01)
(52) U.S. Cl. ......... 365/145; 365/146; 365/148; 369/126
(58) Field of Classification Search .................. 365/145, 365/146, 148, 158, 163, 171, 173; 369/100, 369/126
See application file for complete search history.

(56) References Cited

U.S. PATENT DOCUMENTS

| | | | |
|---|---|---|---|
| 3,835,301 A | 9/1974 | Barney | |
| 5,060,191 A | 10/1991 | Nagasaki et al. | |
| 5,086,216 A * | 2/1992 | Mollet et al. | 235/492 |
| 5,323,377 A | 6/1994 | Chen et al. | |
| 6,055,180 A * | 4/2000 | Gudesen et al. | 365/175 |
| 6,403,396 B1 * | 6/2002 | Gudesen et al. | 438/99 |
| 6,432,739 B1 * | 8/2002 | Gudesen et al. | 438/99 |

(Continued)

FOREIGN PATENT DOCUMENTS
JP 2-96889 A 4/1990
(Continued)

*Primary Examiner* — Tuan T Nguyen
*Assistant Examiner* — Lance Reidlinger
(74) *Attorney, Agent, or Firm* — Birch, Stewart, Kolasch & Birch, LLP

(57) ABSTRACT

In a non-volatile electric memory system a memory unit and a read/write unit are provided as physically separate units. The memory unit is based on a memory material that can be set to at least two distinct physical states by applying an electric field across the memory material. Electrodes and/or contacts are either provided in the memory unit or in the read/write unit and contacts are at least always provided in the read/write unit. Electrodes and contacts are provided in a geometrical arrangement, which defines geometrically one or more memory cells in the memory layer. Establishing a physical contact between the memory unit and the read/write unit closes an electrical circuit over the addressed memory cell such that read, write or erase operations can be effected. The memory material of the memory unit can be polarized into two discernible polarization states.

23 Claims, 7 Drawing Sheets

U.S. PATENT DOCUMENTS

Figure 1:
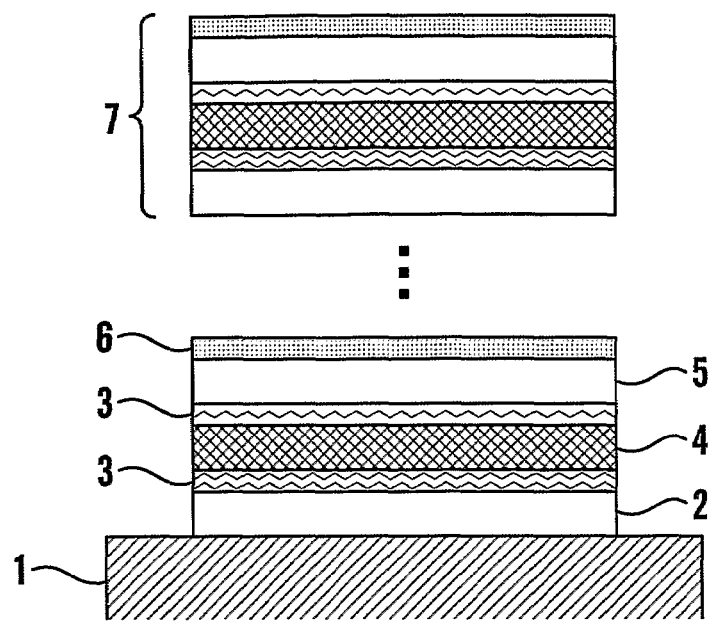

| | | | |
|---|---|---|---|
| 6,541,869 B1 * | 4/2003 | Gudesen et al. | 257/777 |
| 6,894,392 B1 * | 5/2005 | Gudesen et al. | 257/759 |
| 7,764,529 B2 * | 7/2010 | Leistad et al. | 365/51 |
| 2005/0156271 A1 | 7/2005 | Lam et al. | |

FOREIGN PATENT DOCUMENTS

| | | |
|---|---|---|
| JP | 2-154389 A | 6/1990 |
| JP | 2002-533928 A | 10/2002 |
| WO | WO 9858383 A2 * | 12/1998 |
| WO | WO 9944229 A1 * | 9/1999 |
| WO | WO 9945582 A1 * | 9/1999 |
| WO | WO 9966551 A1 * | 12/1999 |
| WO | WO 0038234 A1 | 6/2000 |
| WO | WO-2005/008574 A1 | 1/2005 |

* cited by examiner

CARD-LIKE MEMORY UNIT WITH SEPARATE READ/WRITE UNIT

The present invention concerns a data storage device comprising a card-like memory unit and a read/write unit provided as physically separate units.

There are a number of situations when there is a need for a method to locally store digital information on objects. Today there are three dominating methods to achieve this. The first is to use a magnetic material that is read and written using an external read/write unit, the second is to use printed bar codes that are a form of read-only memories being read by optical methods, and the third is to use chip-based memories such as flash memories. The different techniques all have their strengths and weaknesses. The chip based memories (e.g. SIM-cards) include the drive circuits and control logic on the memory device, causing high manufacturing costs. Also, the chip-based memories require transistors to be present on the memory devices something which results in that the number of possible manufacturing methods is limited. In practice they are all built on Si wafers. The magnetic stripes are re-writeable, but bar codes are not. Magnetic stripes, as used today, are read by an external unit that has a relative speed compared to the memory device, while bar codes are normally read while the read unit and the memory device are at rest. The bar codes are very low cost printed devices, while the magnetic stripe must be manufactured in a controlled environment and later laminated inside the target item. The data densities of the bar codes are very low, and the data capacity of the magnetic stripes is limited by the length of the stripe since it is read using a constant relative speed between the memory and the read/write unit. In practice the storage capacity of magnetic stripes are limited to not much more than a few hundred bytes. The drawbacks of the magnetic stripes, such as limited data content, high manufacturing costs and the need for a relative speed between the memory device and the read/write equipment are inherent and undesirable.

Considering the disadvantages of existing technologies and solutions for simple memory cards and considering their extremely widespread and frequent use it is evident that there is a need for a improvement in the technology based on data storage means that can be implemented in the conventional and readable memory card format and in addition provide a significant gain with respect to quality, storage capacity, simplicity, reliability, particularly for read/write operations, and which moreover can be manufactured in high volumes and low cost. This also implies that it should be rewriteable and be employed with rewrite equipment that does not differ conceptually from today's card readers; it should for instance not require any moving parts, and the input/output operations should be performed without maintaining a relative speed between the memory card and the read/write equipment. Also a memory card of this kind should be possible to manufacture with low cost high-volume manufacturing methods. These include as per se conventional printing techniques which up to now to little extent have been applied to the manufacturing in the electronics and integrated circuit industry, but nevertheless has been shown to be able to fabricate high-performance components reliably and with high yield. In addition printing techniques also have the advantage that they make it a lot more easy to employ different materials, inorganic as well as organic, as the constituents of the components manufactured, but at the same time the incompatibility problems encountered in conventional fabricating processes when using such materials are avoided. These incompatibility problems may be thermal, mechanical or chemical and can significantly impair the functionality of one or more functional materials.

Hence the object of the present invention is to provide an improved memory card which avoids the above-mentioned disadvantages of existing memory cards, but which retains any advantages thereof in addition to providing an increased storage capacities, high reliability and lower fabrication cost.

Another object of the present invention is to provide such memory cards based on data-storage technologies which hitherto has been applied only to more advanced data storage systems.

A further object is to provide such memory card wherein data are stored and input and output by electrical means.

A final, but important object of the invention is to be able to employ novel materials including organic ones for the memory media, and which moreover can be processed by fabrication methods which do not impair the performance.

The above objects as well as further features and advantages are realized with a data storage device according to the invention, wherein the memory unit comprises a patterned or unpatterned layer of a memory material capable of attaining at least two distinct physical states and/or being set to either thereof or switched therebetween upon applying an electric field across the memory material, wherein said at least two distinct physical states are characterized by an impedance value or a polarization value, wherein the electric field is applied at specific positions and with a specific direction so as to define a memory cell with a determined extension in a volume of the memory material at the specific position for storing a datum given by a logical value as assigned to the distinct physical state set in the memory cell by the applied electric field, wherein the logical value can be detected and read by applying a potential difference across the memory cell, wherein the memory unit comprises one or more linear arrays of memory cells provided in a patterned or unpatterned layer of memory material, one or more bottom electrodes provided interfacing a bottom surface of the memory layer, wherein each said one or more bottom electrodes comprises one contact means and contacts at least one memory cell and at most all memory cells in one linear array of memory cells, wherein a plurality of top electrodes are provided interfacing and extending over a top surface of the memory layer, wherein each of the top electrodes comprises one contact means and contacts at least one memory cell and at most all memory cells in a linear array of memory cells, whereby a memory cell is defined in the layer of memory material between a crossing bottom and top electrode, wherein a read/write unit comprises contact means provided in a geometrical arrangement corresponding to the geometrical arrangement of the contact means of the memory unit, thus enabling a direct electrical connection between the read/write unit and the memory unit upon establishing a mutual engagement therebetween, whereby the electrical connection closes an electrical circuit over each memory cell, thus enabling the application of a potential difference over the latter such that dependent on the sign and magnitude of the applied potential difference a read/write and erase operation can be effected to the memory cells.

Additional features and advantages of the data storage system of the present invention will be apparent from preferable embodiments as disclosed in the appended dependent claims.

Figure 2:
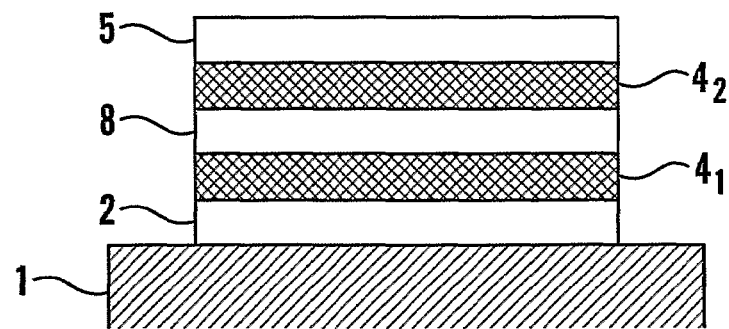
Figure 3:
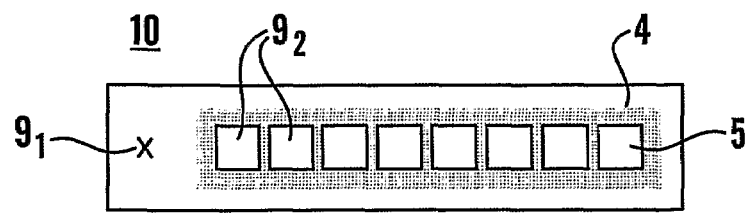
Figure 4A:
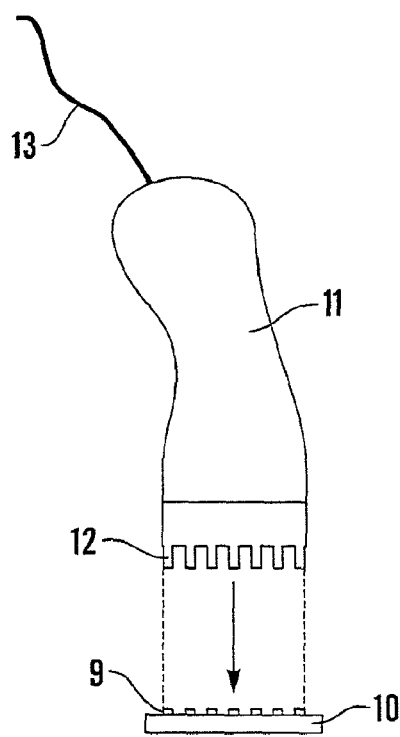
Figure 4B:
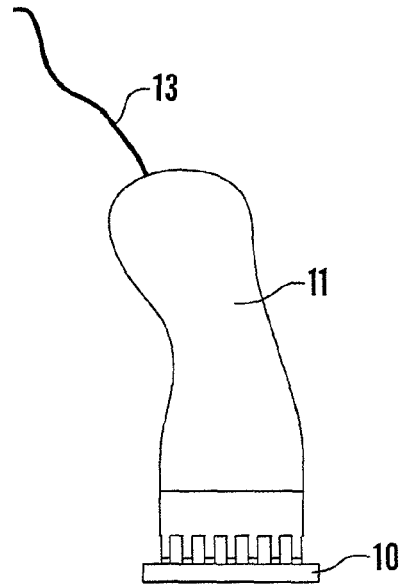
Figure 5:
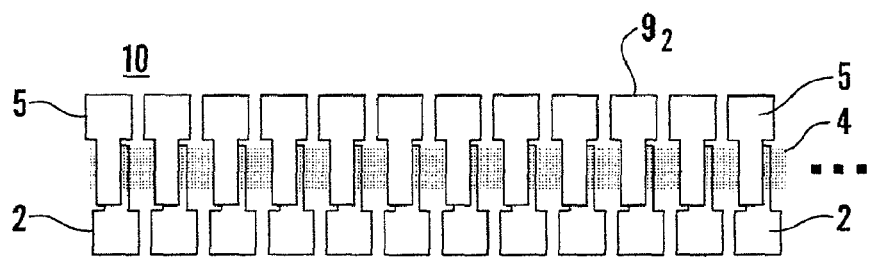
Figure 6:
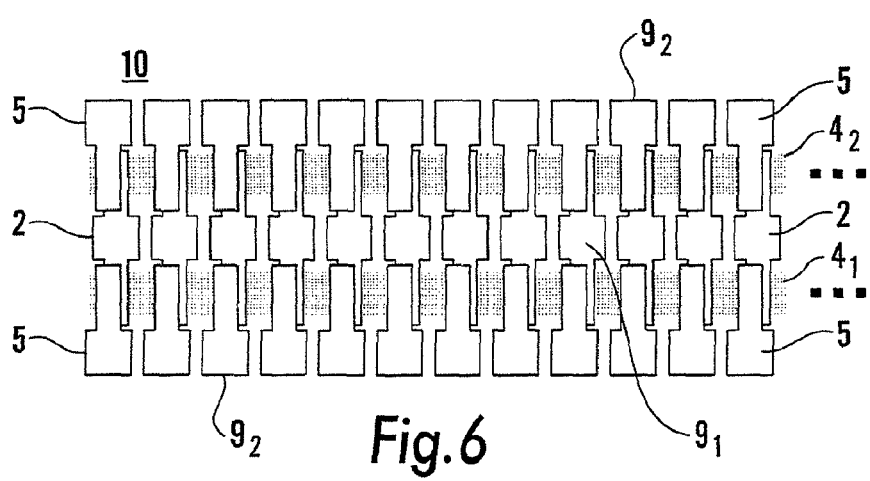
Figure 7A:
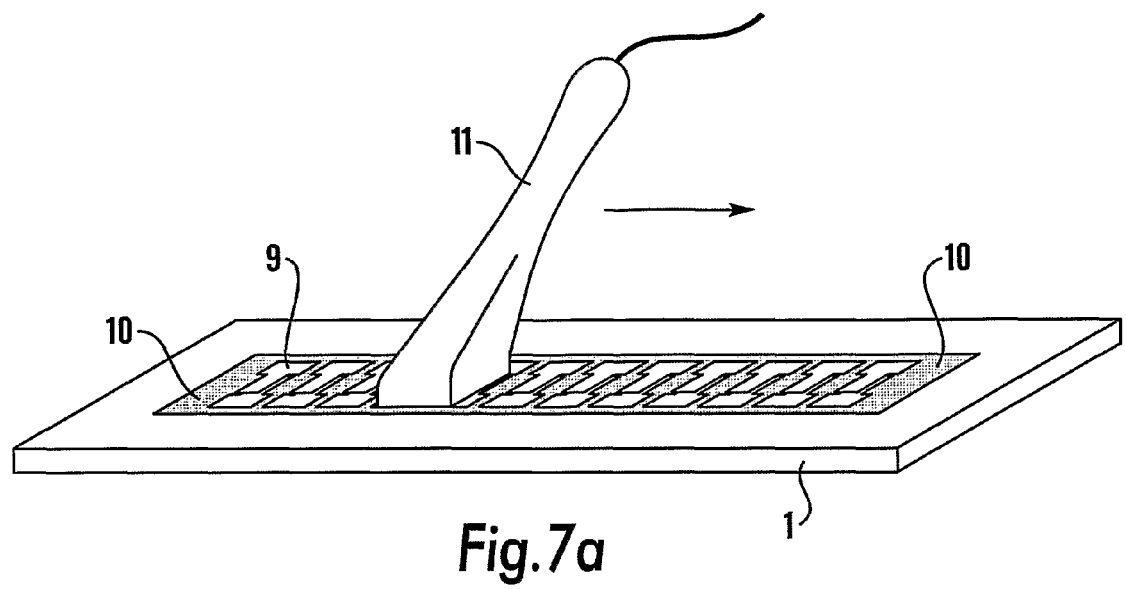
Figure 7B:
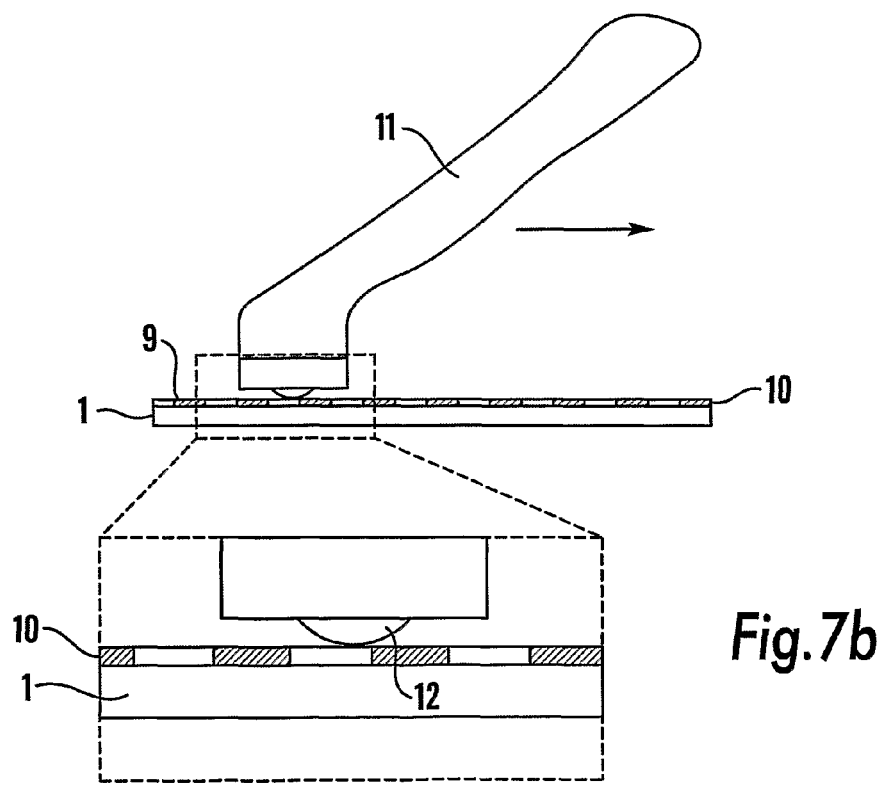
Figure 7C:
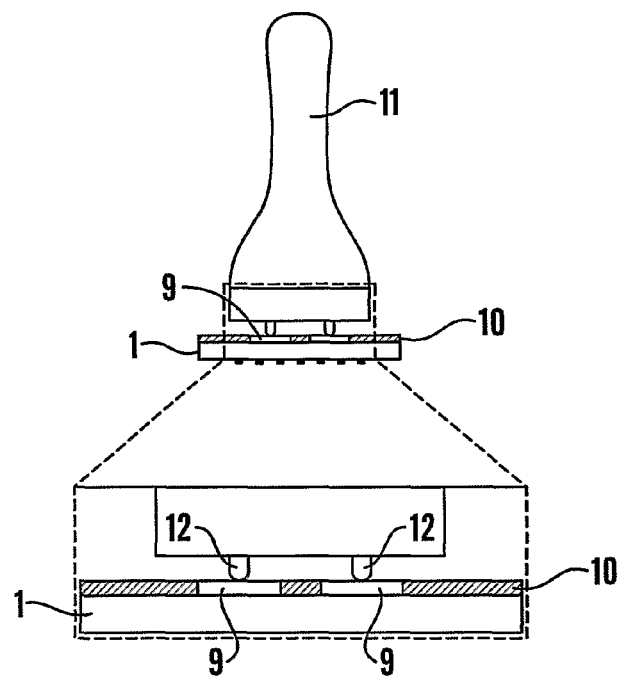
Figure 8:
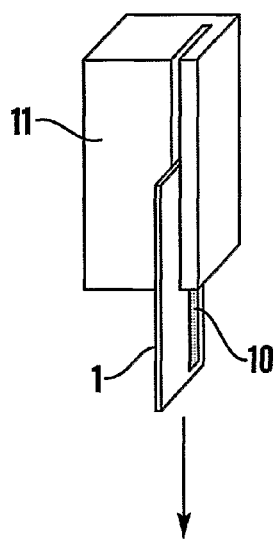
Figure 9:
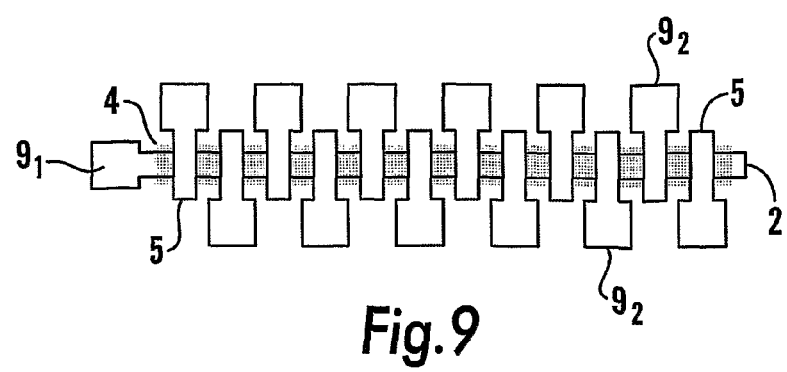
Figure 10A:
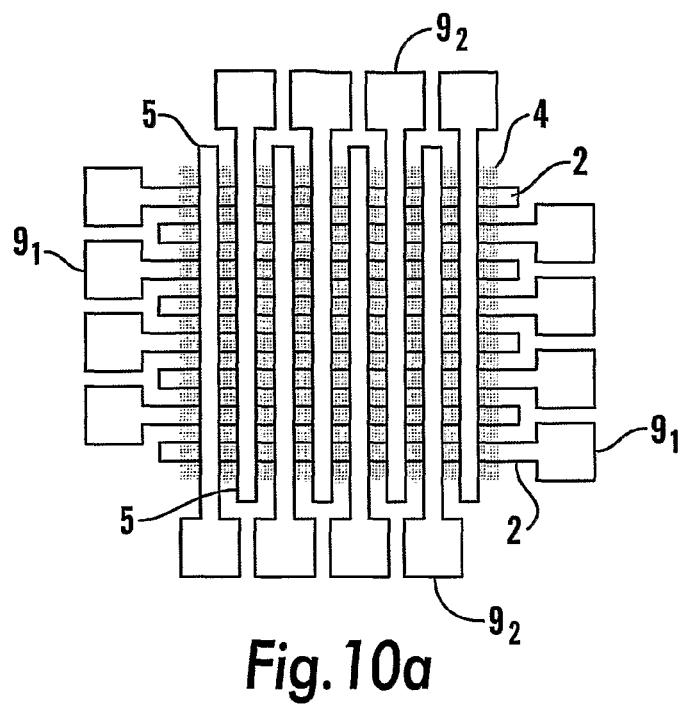
Figure 10B:
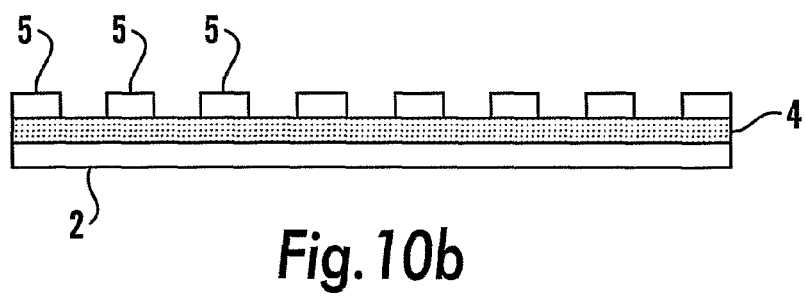
Figure 11A:
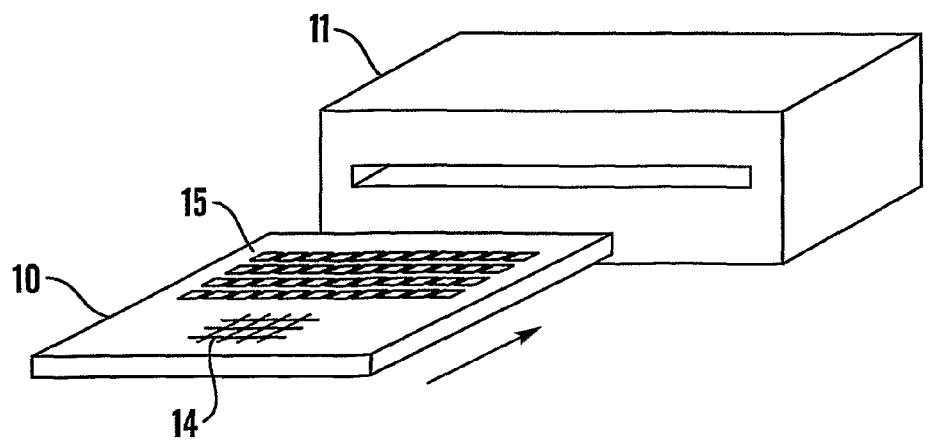
Figure 11B:
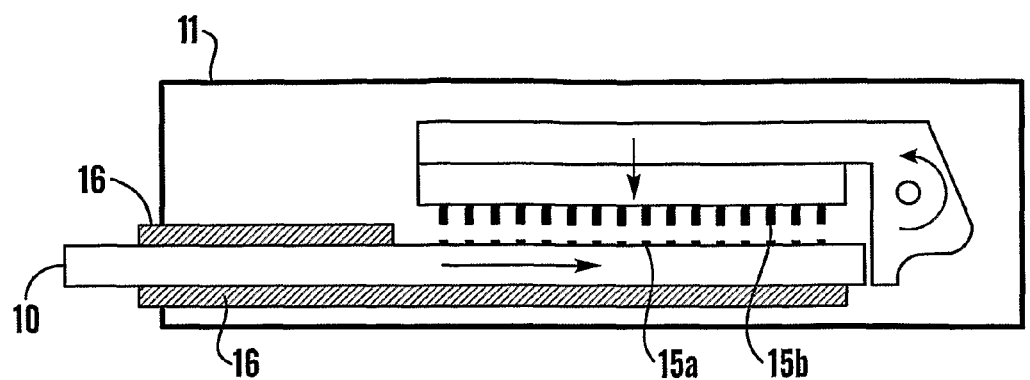
Figure 11C:
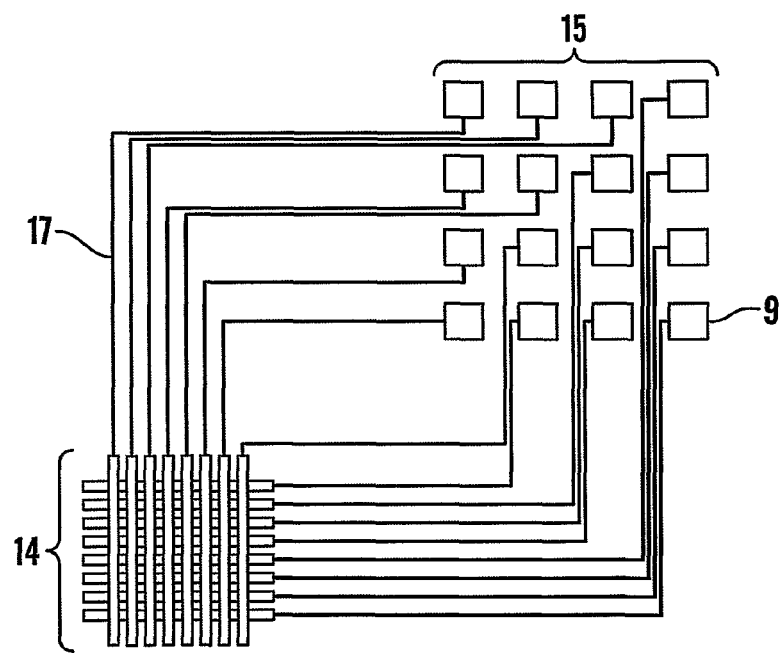
Figure 11D:
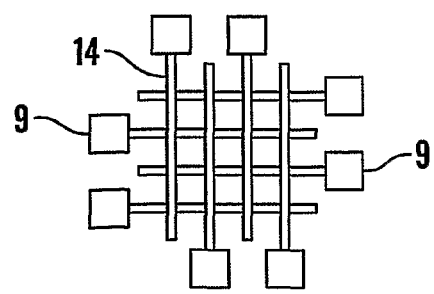
Figure 12A:
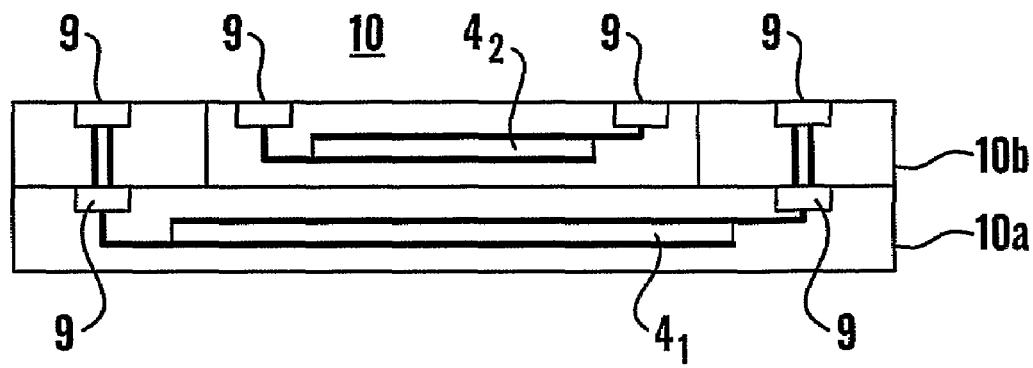
Figure 12B:
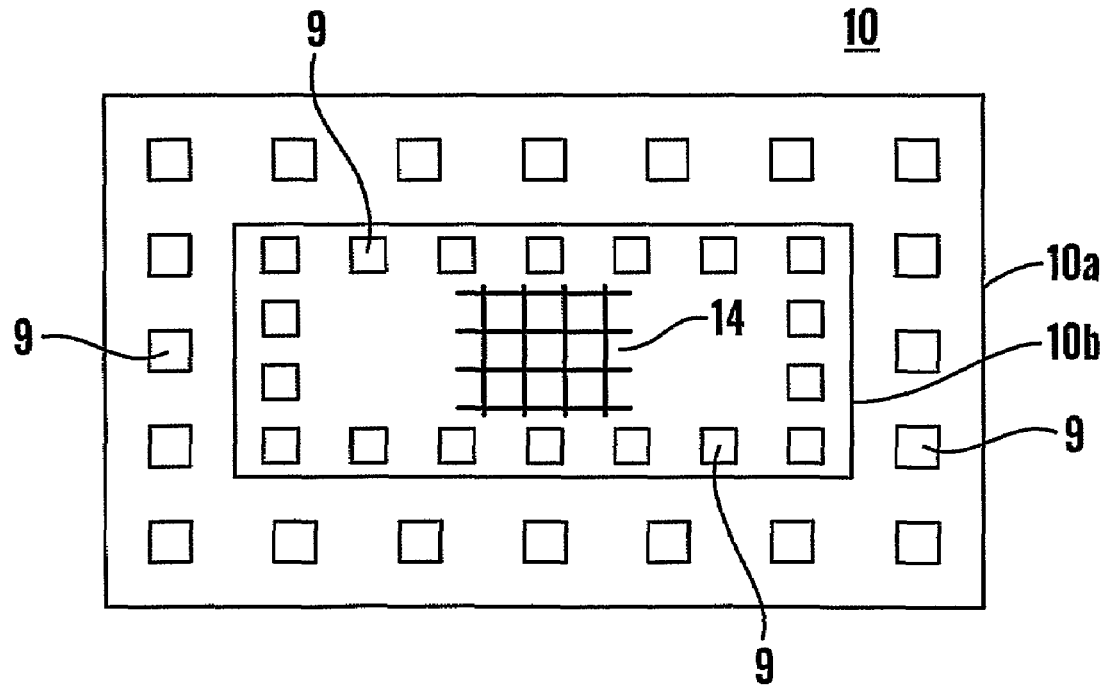

The invention shall now be explained in more detail by resorting to a discussion of exemplary embodiments thereof and with reference to the accompanying drawing figures, wherein FIG. 1 schematically shows the basic building blocks of a memory cell, as may be used in the present invention, FIG. 2 schematically the basic building blocks of a bilayer memory cell, as may be used in the present invention, FIG. 3 a first embodiment of a memory unit according to the present invention, FIGS. 4a, 4b a first embodiment of the data storage device according to the present invention, FIG. 5 a second embodiment of a memory unit according to the present invention, FIG. 6 a third embodiment of a memory unit according to the present invention, FIG. 7a a second embodiment of the data storage device according to the present invention, FIGS. 7b, 7c details of the data storage device in FIG. 7a FIG. 8 a third embodiment of the data storage device according to the present invention, FIG. 9 a fourth embodiment of a memory unit according to the present invention, FIG. 10a a fifth embodiment of a memory unit according to the present invention, FIG. 10b a side view of the embodiment in FIG. 10a, FIG. 11a a third embodiment of the data storage device according to the present invention, FIG. 11b a side view of the embodiment of the data storage device in FIG. 11a, FIG. 11c schematically a plan view of the memory unit used in the embodiment in FIG. 11a, FIG. 11d a plan view of a variant of the memory unit in FIG. 11c, and FIGS. 12a, 12b respectively a side view and a plan view of a memory unit with stacked memory layers.

A memory cell which can be used in the memory unit in the present invention shall now be discussed with reference to FIG. 1.

The memory cell is built on a smooth and non-conductive substrate 1, which moreover shall not react with the material of a thereabove provided bottom electrode 2, but apart from that the substrate can be made from a number of candidate materials, rigid as well as flexible and including e.g. silicon wafers, polymer film, paper, coated metal foils and so on. The memory cell is structured as a stack of essentially thin-film layers. These are from the substrate and up, the bottom electrode 2, the memory material or film 4 and a top electrode 5. In addition interlayers 3a can be provided between the memory material 4 and/or the bottom and top electrodes 2;5 respectively. It is also to be understood that the memory material 4 can be a composite or a mixture or various materials giving the overall memory material its overall functionality for storing and retaining data. On the top of the memory cell structure an optional protection layer 6 can be provided. This overall finished stacked thin-film structure conforms to the component 7, and it is indicated how a vertical stack of such memory cells can be formed by simply placing such memory cell components 7 on the top of each other. It is also evident that such memory cell structures can be provided juxtaposed on one and the same substrate to form memory cell arrays of various configurations and in various geometrical arrangements. The various thin-film layers of such memory arrays can then be contiguous and global in the array, while for instance top and bottom electrodes must be suitably patterned such that each memory cell can be selected and addressed individually for a data storage or data retrieval operation. Commonly this is achieved by patterning for instance the bottom electrodes as a set of parallel stripe-like electrodes and then patterning the top electrodes as a set of likewise parallel stripe electrodes, but oriented orthogonally to the bottom electrodes, such that it is possible to define a memory cell in the volume of memory material between the crossing of a top and bottom electrode.

Also the memory cell structure could be formed as a bilayer structure as shown in FIG. 2. As before a bottom electrode 2 is deposited on the substrate 1 and it now follows a first memory layer $4_1$, a common electrode layer 8, followed by a second memory layer $4_2$ and the structure is finally capped with the top electrode 5. Two memory cells are thus defined in this structure and it is seen that the common electrode 8 respectively forms the top electrode of the first cell, while it is also the bottom electrode of the second cell. This shall increase the volumetric storage capacity, but also simplify the fabrication as the number of electrodes in a stacked structure is not twice the number of memory layers, but instead one more than the number of memory layers. This particular embodiment is explained thoroughly in for instance international published patent application WO98/58383 belonging to the present applicant.

The present invention shall be better understood from the following discussion of various preferred embodiments thereof, particularly in regard of the memory unit itself.

In the discussion of the preferred embodiments, the disclosure is generally limited to the materials and components required to realize the absolute necessary functions of the memory units. The same consideration also applies to the drawing figures of the various embodiments, wherein the substrate e.g. usually is deleted.

A first preferred embodiment of a memory unit according to the present invention is shown in FIG. 3. Memory material 4 is deposited on the bottom electrode 2, which also incorporates contact means 9 indicated simply by the x. The top electrode 3 is shown as a row of a number of patterned electrodes 5 deposited on the memory material or memory layer 4. These separate electrodes 5 also form the contact means $9_2$ of the memory cells, and it can generally de described as a unit with a linear array of memory cells formed in the memory layer 4 between the contact means $9_2$ and the bottom electrode 2.

A first preferred embodiment of the data storage device of the present invention is shown in FIGS. 4a and 4b. Further FIGS. 4a and 4b detail the use of the memory unit of FIG. 3 in conjunction with a read/write unit 11. FIG. 4a shows how the contact means of the memory unit 10 is contacted by moving e.g. the hand-held read/write unit 11 down to contact the memory unit 10. The read/write unit 11 comprises contact means 12 e.g. in the form of contact pins or pads and provided in a contact portion thereof. The contact means are provided in a geometrical arrangement or pattern to furnish an exact match with the contact means 9 on the memory unit 10. It should be noted that in FIGS. 4a, 4b, also the contact means $9_1$ at point x of the bottom electrode 2 is included in the linear array of contact means 9, such that when contact means 12 on the read/write unit 11 engage with the corresponding contact means 9 in the memory unit 10, an electric circuit is established through the memory cells of the memory unit 10. Of course the read/write unit 11 can also be a mechanically moved unit and as such a part of e.g. a terminal device or the like. Further the read/write unit 10 as stated may comprise the required circuitry for driving, sensing and control, but this circuitry could also be part of a peripheral unit not shown in FIG. 4a or 4b and then the read write unit should be connected thereto via appropriate means such as cord 13. The embodiment as shown in FIGS. 3 and 4a, b is regarded as suitable for data storage applications where the storage capacity requirement is low.

A second embodiment of the memory unit 10 of the data storage device according to the present invention is shown in FIG. 5. Again the memory cells are defined as a linear array in the memory layer 4 (shaded in the figure) and each memory cell is provided with a bottom electrode 2 with contact means $9_1$ forming a row along the side of memory layer 4 on one side thereof. Each memory cell is also provided with a top electrode 5 on the opposite surface of the memory layer 4 and with similar contact means provided $9_2$ along a side of the memory layer 4 and opposite the contact means $9_1$ of the bottom electrodes 2.

A third embodiment of a memory unit in the data storage device according to the present invention is shown in FIG. 6. This embodiment resembles that in FIG. 5, but now all the memory material has been provided in two parallel stripe-like layers $4_1$, $4_2$ such that two linear arrays of memory cells can be formed in the memory unit. Bottom electrodes 2 are provided such that they are common to pairs of memory cells, with each cell of the pair being located in the respective layer $4_1$, $4_2$ of memory material in the manner shown. Here the contact means $9_1$ of the bottom electrodes are provided in the gap between the parallel memory layers $4_1$, $4_2$. However, for each memory cell there is provided a separate top electrode 5 with the contact means $9_2$ provided in a row along side edges of respective memory layers 4. The embodiments of the memory units shown in FIGS. 5 and 6 can both be addressed in stationary on sliding engagement with a read/write unit according to the present invention and as a person skilled in the art may know, the read/write unit 11 for a stationary addressing operation shall comprise contacts in the form of contact pins or contact pads provided in a geometrical arrangement and patterned exactly similar to the geometrical pattern of the contact means $9_1$, $9_2$ of the embodiments in FIGS. 5 and 6. The addressing of memory units corresponding to the embodiments in FIGS. 5 and 6 shall now be discussed with reference to FIGS. 7a-c and FIG. 8.

FIG. 7a depicts a second embodiment of the data storage device of the invention and with the memory unit 10 provided with a substrate 1 and contact pads 9 as shown in the surface of the memory unit 10. A hand-held read/write unit 11 is now translated in a sliding movement along the memory unit 10 and shall in succession contact the contact means 9. It is also of course to be understood that the read/write unit 11 need not be hand-held unit, but can be moved by mechanical means.

FIG. 7b provides a side view of the operation of the read/write unit 11 in FIG. 7a. The components are of course the same as already shown in FIG. 7a but now with the addition of sliding contacts 12 incorporated in the read/write unit 11. The sliding contact means 12 could be realized as shown in FIG. 7b as two or more leaf springs and shall then providing adequate contact when a hand-held read/write unit 11 is translated in a sliding movement. The positions of the sliding contacts in the read/write unit 11 of course must correspond to the row arrangement of the contacts 9 in either FIG. 5 or FIG. 6. However, instead of the sliding contacts 12, contacts in the form of rollers and the like could also be provided, of course dependent on the arrangement of the contact pads in the memory unit. FIG. 7c shows the memory unit 10 and the read/write unit 11 viewed in the direction of a motion and with the same components labelled as before. The memory unit 10 also here corresponds to one of the embodiments shown in FIGS. 5 and 6 with contact pads 9 in the memory unit 10 being engaged by respective sliding contacts 12 mounted in a read/write head of the read/write unit 11. As before the sliding contacts 12 can be leaf springs.

FIG. 8 shows the memory unit 10 of the invention used with a stationary read/write unit 11 which of course also forms part of the data storage device of the invention, but otherwise would resemble fixed stationary units as known in the art for reading conventional memory cards such as magnetic cards and the like. The card-like memory unit 10 is as in the prior art inserted in a slot on the stationary read/write unit 11, and the addressing operation is carried out in a sliding movement as the contact means of the memory unit 10 engages corresponding; for instance sliding contact means in the read/write unit 11.

An obvious advantage with the embodiments that allow the use of sliding movement of the read/write unit to carry out an addressing operation by either moving the read/write unit or the memory unit, of course has the advantage that the contact arrangement of the read/write unit shall be much simplified, and would not need to form a geometrical arrangement and pattern mimicking the corresponding geometrical arrangement and pattern of the contact means in the embodiment shown e.g. in FIGS. 5 and 6. As would be obvious to a person skilled in the art, only a pair of sliding contacts in the read/write unit be sufficient to read the memory unit of FIG. 5, while for the memory unit shown in FIG. 6 three sliding contacts in the read/write unit 11 are required. It should be noted that in the case the read/write unit 10 is a hand-held unit, it is translated in sliding contact with the memory unit 10. The scale of the contact means and the arrangement of the memory cell arrays are such that it is no problem to maintain the appropriate engagement and physical contact for obtaining a reliable addressing even with a hand-moved read/write unit 11.

A fourth embodiment of the memory unit according to the invention is shown in FIG. 9. Herein a single bottom electrode 2 with contact means 9, is provided as a common word line for all memory cells provided in a single linear array in the memory layer 4. The top electrodes 5 are provided orthogonally to the common bottom electrode 2 on the opposite side of the memory layer and with the contact means $9_2$ provided alongside the periphery of the layer 4 of memory material. The contact means 9 easily allows for a stationary contact in a suitable engagement with a read/write unit 11 comprising contact means in the form of e.g. contact pins or contact pads in a geometric arrangement corresponding to the geometric arrangement of the contact means 9 in the memory unit 10 as depicted in FIG. 9. In other words, both the word line electrode 2 and the bit line electrodes 5 are contacted simultaneously in a stationary engagement between the memory unit 10 and the read/write unit 11. For sliding contact the read/write unit 11 will employ sliding contact means 12 similar to those in FIG. 7b or 7c.

A fifth embodiment of the memory unit according to the invention is shown in FIG. 10. This memory unit 10 resembles a so-called matrix-addressable array that is used in various types of semiconductor memories, as well known to a person skilled in the art. A first set of parallel stripe-like bottom electrodes 2 are provided on one side of a global layer 4 of memory material. The parallel stripe-like bottom electrodes 2 form the word lines in a memory matrix and terminate in contact means $9_1$, as before. Similarly the top electrodes 5 are provided on the opposite surface of the memory layer 4 and with parallel stripe-like electrodes oriented orthogonally to the word line electrodes and forming bit lines in the memory matrix and likewise terminated in contact means $9_2$. In order to accommodate shown structure without placing too heavy demand on real estate capacity, the contact means alternate along the side edges of the layer 4 of memory material such that four linear arrays of contact means are formed along the periphery. FIG. 10b is a side view of the embodiment in FIG. 10a with the bottom (word-line) electrodes 2 and the top (bit-line) electrodes 5 separated by the memory layer 4.

Although the memory unit structurally resembles a matrix-addressable memories as known in the art, no driving or multiplexing circuitry are included therein and hence its capacity is limited only by the number of contact pads. As a person skilled in the art shall understand the ratio between the number of the word lines and bit lines can be freely chosen, for instance as 1:N, where N is the number of bit lines, an embodiment that corresponds to the memory unit shown in FIG. 9 as a square matrix, i.e. N·N matrix with equal numbers of word lines and bit lines 2;5, and finally, as a rectangular M·N matrix, with M word lines and N bit lines 2;5 such that M≠N. In the embodiment of the memory unit in FIG. 9 with a single word line and with a total number n of nine contact means the number of data bits that can be stored will be equal to n−1. In a square matrix embodiment of the memory unit 10 as shown in FIG. 10, the number of data bits that can be stored correspondingly shall be $n^2/4$. For instance when referred the embodiment in FIG. 10 it is seen that the square matrix comprises 64 bit spots and hence can store 64 data bits. The number n of contact means 9 is the sum of the number of word line and bit line electrodes, being in this case of course 16, yielding a storage capacity $16^2/4=64$ data bits.

An increasing number of memory cells and contact means in the memory unit 10 as used in the data storage device according to the invention requires more accurate procedures to handle the engagement between the memory unit and the read/write unit 11 to obtain a high-quality addressing operation. For instance could a read/write unit 11 as depicted in either of the FIG. 11a or 11b be used. Here the contact means 9 are provided as a separate array 15 outside the memory cell matrix 14 comprising the memory layer 4. This array 14 can of course be regarded as composed of separate parallel linear contact arrays constituting either rows or columns of the matrix depending on agreed convention. The detailed layout of the memory matrix and the contact means array shall be explained immediately below. The whole memory unit 10 inserted in a slot in the read/write unit 11 and for this purpose and to ensure proper engagement, the read/write unit 11 may be provided with guiding and retaining means 16 for guiding the sliding movement of the memory unit 10. The array of contact means 15a, which can be significantly larger than the memory cell matrix 14, engages with the corresponding array of contact means 15b in the read/write unit 11, comprising for instance contact pins or pads. The array of contact means 15b in the read/write unit can be easily controlled to carefully land on the corresponding contact means 9 in the memory unit as depicted in FIG. 11b.

As shown in FIG. 11c the contact means 9 provided in the array 15 are connected to the bit line and word line electrodes of the memory matrix 14 by a suitable routing of contact lines. As depicted in the embodiment illustrated in FIG. 11c there are 64 bit spots in the memory matrix 13, which is a square matrix with 8 word lines and 8 bit lines, making 16 in all and hence the matrix 15 comprises 16 contact means 9. Another arrangement of the contact means 9 for a memory cell matrix 14 is shown in FIG. 11d and here the contact means are provided on the periphery of the memory cell matrix and alternating from side to side as shown. Of course the contact means 15b of the read/write unit 11 shall be correspondingly disposed. The advantage of using a separate array 15 for the contact means 9 is that it is in no way limited by the size of the memory cell matrix 14 or has to scale to its dimensions. The memory cell matrix 14 can indeed be made very small. In a matrix-addressable array of for instance ferroelectric or resistive memory cells the latter can be provided (i.e. pixelated) with pitches in the range of 0.2 μm and even less, such that a memory layer area of say only a square millimeter easily could accommodate millions or memory cells. If the storage capacity is not that large, features can also be made larger making fabrication easier and less costly, and lessen the amount of production and quality controls needed to ensure high quality products as whole, as more faults and defects are likely to occur with reduced line widths and pitches.

In other words, when the adequate data storage capacity is achieved in a memory matrix occupying at most few square millimeters, the contact array could be made large to ensure reliable operation. This possibility of scaling a contact array is facilitated by the fact that the number of contacts scales as M+N, i.e. the sum of word lines and bit lines (bottom and top electrodes 2;5), while a number of memory cells scales asM·N.

Finally it should be noted that since the electrode layers can be very thin and the thickness of the memory layer 4 extremely small, all layers can be fabricated with a total thickness dimension below 1 μm. This would favour the use of volumetric memory units, i.e. where data is not stored in a single planar memory layer, for instance as the vertical stack of such layer appropriately electrically connected, as noted in connection with the discussion of FIG. 1 or FIG. 2. Although such architectures and configurations not necessarily would be required by memory unit of the present invention or as known in the prior art and which is tailored to be application specific and not for use in computer equipment, it is not difficult to implement a volumetric card architecture as shown in cross section in FIG. 12a where two memory layers $4_1, 4_2$ are used in one and the same memory unit. As will be noted this is achieved by using a stepped and staggered arrangement of the memory layers allowing the contact means 9 to be located in a suitable geometric arrangement outside the area occupied by the memory layers 4 and in the vicinity of the edge portions of the memory unit 10 as shown in plan view of FIG. 12b. Due to the staggered arrangement the memory layer $4_1$ in the subunit 10a can have a larger storage capacity then the memory layer $4_2$ in the subunit 10b. Otherwise is the embodiment shown in FIGS. 12a and 12b would present the same appearance to the user and the read/write unit of the invention as a card-like memory unit with a single memory layer. The actual arrangement of the memory and a geometrical arrangement of the memory matrix 14 and the contact means 9 in either subunits 10a, 10b in FIGS. 12, 12b could for instance resemble the arrangement shown in FIG. 11d.

The electrodes could be manufactured using metal deposited and patterned by any standard method such as evaporation, sputtering, and photolithographic techniques or using e.g. polymer based conductive inks deposited by e.g. inkjet, flexo-printing or any other appropriate technique.

The memory film could be deposited by spin-coating a layer of electric film between the two electrode layers. Other techniques, such as inkjet, flexo-printing, evaporation etc can also be used to deposit the electric memory layer.

The read/write unit has two main tasks. The first is to generate the needed voltage waveforms to control the read and write of the memory cells. The second is to sense the state of the memory cells during read.

The operation of the memory requires that well controlled voltage waveforms both in time and magnitude are applied to the electrodes. This can be achieved either with standard discrete electronic components or with an application specific integrated circuit. If the memory material is a ferroelectric material large enough applied voltage will force the dipoles in the ferroelectric memory film to align in the direction of the electric field between the electrodes, thus storing information in the polarization direction of the material. Basic information on the operation of ferroelectric memory cells is available in the literature. Similarly a material having resistive impedance characteristics can have its resistance set by an applied external field thus being able to store data represented by stable resistance values. A memory material of this kind, for instance a metal-organic salt like M(TCNQ) could be used to realize multibit memory cells.

The sense circuitry shall make a decision on the state of the memory cell based on the amount of charge coming from the cell due to the charge displacement in the ferroelectric material during the read voltage pulse. This can e.g. be done with a simple Sawyer tower configuration or with a current integrator, both of which can be realised with discrete circuits. For large capacity memories however, it may be worthwhile to construct an application specific integrated circuit to do this.

If the memory material of the data storage device of the invention is a ferroelectric or electret material capable of being polarized in either of two remanent polarization states and exhibiting hysteresis, a datum is stored in a memory cell by assigning a logical value to either of its remanent polarization states, i.e. the negative or positive polarization state. Read and write operations are carried out on the hysteresis curve by applying electric fields of suitable strength over the memory cell, whereby a switching of the polarization state can be effected by applying a field with a coercive field strength higher than that of a memory cell and a direction opposite the polarization vector of the memory cell. It should be noted that ferroelectric materials properly are a subclass of electret materials. A number of candidate ferroelectric materials well known to a person skilled in the art may include inorganic ceramic materials such as lead zirconate titanate (PZT) or more preferable organic and easily printable ferroelectric oligomers, polymers, or co-oligomers including the well-known poly(vinylidene fluoride-trifluoroethylene) which presently is the most commonly used organic ferroelectric material. Generally these organic ferroelectric materials are inherently incapable of forming diode junctions with a contacting metallic electrode.

In the data storage device according to the present invention the memory material could also be selected as a dielectric material with a linear or non-linear resistive impedance. A material of this kind can be set to specific resistance values by the application of an electric field and by varying the field strength it is possible to set a plurality of specific resistance states in the memory material. In other words, it is possible to store data with multibit coding, e.g. selecting as a set value as one of e.g. four or eight etc. resistance levels and thus being able to store respectively two, three, or more bits. The specific field strength applied will determine the resistance value set. It is also possible to erase the set resistance values by reversing the field. It should also be noted that some (or most) candidate resistive memory materials shall not be able to spontaneously form a diode junction with the contacting metallic electrode, but in order to form such a diode junction a layer of semiconducting material can be provided between the memory layer and the electrode, and a Schottky junction will then be generated. A person skilled in the art will be familiar with candidates for the resistive memory materials, but they may for instance be selected as a phthalocyanine compound, an organic small-molecule compound, a metal-organic salt like the well-known M(TCNQ), an oligomer, a polymer or a copolymer.

The invention claimed is:

1. A non-volatile electrical data storage device comprising:
   a card-like memory unit; and
   a read/write unit; the memory and read-write units being provided as physically separate units,
   wherein the memory unit includes a memory layer that includes a memory material capable of attaining one or more of at least two distinct physical states by the application of an electric field across the memory material,
   wherein said at least two distinct physical states are distinguished by an impedance value or a polarization value,
   wherein the electric field is applied at specific positions and with a specific direction so as to define a memory cell with a determined extension in a volume of the memory material at the specific position for storing a datum given by a logical value as assigned to the distinct physical state set in the memory cell by the applied electric field,
   wherein the logical value can be detected and read by applying a potential difference across the memory cell,
   wherein the memory unit includes
   one or more linear arrays of memory cells provided in said memory layer,
   one or more bottom electrodes provided interfacing a bottom surface of the memory layer, each said one or more bottom electrodes including one contact and contacting at least one memory cell and at most all memory cells in one linear array of memory cells,
   a plurality of top electrodes interfacing and extending over a top surface of the memory layer, each of the top electrodes including one contact and contacting at least one memory cell and at most all memory cells in a linear array of memory cells,
   such that a memory cell is defined in the memory layer between a crossing bottom and top electrode, and
   wherein the read/write unit includes contacts provided in a geometrical arrangement corresponding to the geometrical arrangement of the contacts of the memory unit, thus enabling a direct electrical connection between the read/write unit and the memory unit upon establishing a mutual engagement therebetween, whereby the electrical connection closes an electrical circuit over each memory cell, thus enabling the application of a potential difference over the latter such that, dependent on the sign and magnitude of the applied potential difference, a read, write, or erase operation can be effected to the memory cells.

2. A data storage device according to claim 1,
   wherein all contacts of the memory unit are provided outside the area occupied by the memory layer.

3. A data storage device according to claim 1, the memory unit comprising more than one linear memory cell array, said arrays forming rows and columns of a rectangular matrix.

4. A data storage device according to claim 3, the bottom electrodes being configured such that the same bottom electrode contacts a pair of memory cells, each member of said pair of memory cells being an element of respective separate adjacent linear arrays.

5. A data storage device according to claim 4, wherein the contacts of the write/read unit are provided in a contacting surface thereof adapted for engaging the contacts of the memory unit in stationary or sliding physical contact.

6. A data storage device according to claim 3, where each row and column of linear memory cell arrays in the rectangular matrix shares a common bottom electrode and a common top electrode (5).

7. A data storage device according to claim 3, wherein the contact of each electrode is provided outside an area occupied by the memory layer and at the periphery of the rectangular matrix, the number of provided contacts being the sum of the number of rows and columns in the matrix.

8. A data storage device according to claim 3, wherein the contacts of both the bottom and top electrodes are provided in a contact matrix located on the memory unit outside the area occupied by the memory layer, the number of rows and columns of the contacts being the sum of the number of the rows and columns in the memory matrix, and each of the contacts in the contact matrix being routed to connect a respective top and bottom electrode.

9. A data storage device according to claim 1, where the contact of the bottom electrodes is provided exposed in the surface of the memory unit, and the contact of the top electrodes is provided exposed in the opposite surface thereof.

10. A data storage device according to claim 1, wherein the contacts of both the bottom and top electrodes are provided exposed in the same surface of the memory unit.

11. A data storage device according to claim 1, wherein the contacts of the read/write unit are configured to be connectable with driving, sensing or control units located either in the read/write unit or in a peripheral unit connected thereto.

12. A data storage device according to claim 1, wherein the read/write unit is adapted for engaging the memory unit in a stationary or sliding physical contact.

13. A data storage device according to claim 12, wherein the sliding physical contact is established by translating the memory unit relative to the read/write unit or vice versa.

14. A data storage device according to claim 12, wherein the read/write unit is a stationary unit.

15. A data storage device according to claim 14, the contacting surface comprising a guide for guiding a movement of the memory unit.

16. A data storage device according to claim 1, wherein the read/write unit is a moveable unit.

17. A data storage device according to claim 1, wherein the memory material is a ferroelectric or electret material capable of being polarized in either of two opposite directions and exhibiting hysteresis, such that data is stored in a memory cell defined in the memory material by assigning a logical value to either of the memory cell's remanent polarization states.

18. A data storage device according to claim 1, wherein the ferroelectric or electret memory material is an inorganic ceramic material of the perovskite kind, an oligomer, a polymer or a co-polymer such as poly(vinylidene fluoride-trifluoroethylene) [P(VDF-TrFE)].

19. A data storage device according to claim 1,
wherein the memory material is a dielectric material having resistive impedance characteristics which can be set to specific resistance values upon the application of a suitable potential difference or electric field thereacross, such that data is stored as specific resistance values in the memory cells, logical values are assigned to said specific resistance values, and the logical values are read and detected by applying a suitable sensing potential difference across the memory material, said sensing potential difference having a value that does not alter the set resistance value of the memory cell.

20. A data storage device according to claim 19, wherein the resistive memory material is a phthalocyanine compound, an organic small molecule compound, a metal-organic salt like M(TCNQ), an oligomer, a polymer, or a copolymer.

21. A data storage device according to claim 19, wherein a layer of an inorganic or organic semiconductor material is provided adjacent to the resistive memory material, such that a diode junction is formed upon contacting said layer of semiconducting material with an electrode material.

22. The data storage device of claim 1, where the memory layer is unpatterned.

23. The data storage device of claim 1, where the memory material is switched between said distinct physical states by the application of said electric field.

* * * * *